(12) United States Patent
Yoo

(10) Patent No.: US 10,327,077 B2
(45) Date of Patent: Jun. 18, 2019

(54) MICROPHONE AND MANUFACTURING METHOD THEREOF

(71) Applicants: HYUNDAI MOTOR COMPANY, Seoul (KR); KIA MOTORS CORPORATION, Seoul (KR)

(72) Inventor: Ilseon Yoo, Suwon-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 10 days.

(21) Appl. No.: 15/657,925

(22) Filed: Jul. 24, 2017

(65) Prior Publication Data

US 2018/0220240 A1  Aug. 2, 2018

(30) Foreign Application Priority Data

Feb. 2, 2017 (KR) .................. 10-2017-0015151

(51) Int. Cl.
| | | |
|---|---|---|
| *H04R 25/00* | (2006.01) | |
| *H04R 19/04* | (2006.01) | |
| *H04R 7/18* | (2006.01) | |
| *H04R 7/06* | (2006.01) | |
| *H04R 19/00* | (2006.01) | |
| *B81B 3/00* | (2006.01) | |
| *H04R 7/20* | (2006.01) | |
| *H04R 31/00* | (2006.01) | |

(52) U.S. Cl.
CPC .......... *H04R 19/04* (2013.01); *B81B 3/0037* (2013.01); *H04R 7/06* (2013.01); *H04R 7/18* (2013.01); *H04R 7/20* (2013.01); *H04R 19/005* (2013.01); *B81B 2201/0257* (2013.01); *B81B 2203/0127* (2013.01); *H04R 31/003* (2013.01); *H04R 2201/003* (2013.01)

(58) Field of Classification Search
CPC . H04R 19/04; H04R 7/06; H04R 7/18; H04R 19/005; H04R 31/003; H04R 2201/003; B81B 3/0037
USPC ....................................................... 381/174
See application file for complete search history.

(56) References Cited

U.S. PATENT DOCUMENTS

| | | | | |
|---|---|---|---|---|
| 5,146,435 A | * | 9/1992 | Bernstein | G01H 11/06 29/25.42 |
| 5,303,210 A | * | 4/1994 | Bernstein | G10K 9/12 367/181 |

(Continued)

FOREIGN PATENT DOCUMENTS

| | | |
|---|---|---|
| JP | 2012-529207 A | 11/2012 |
| KR | 10-0901777 B1 | 6/2009 |
| KR | 10-1601219 B1 | 3/2016 |

*Primary Examiner* — Phylesha Dabney
(74) *Attorney, Agent, or Firm* — Morgan Lewis & Bockius LLP

(57) ABSTRACT

A microphone includes: a substrate configured to have a through hole formed at a central portion thereof; a vibration membrane disposed to cover the through hole on the substrate to include a slit pattern in which slit patterns are arranged in a plurality of lines along a circular edge thereof; a fixed membrane separately mounted at an upper portion of the vibration membrane with an air layer therebetween to have a plurality of air inlets that extend therebetween in a direction of the air layer; and a support layer configured to support the fixed membrane separately mounted on the vibration membrane.

14 Claims, 11 Drawing Sheets

(56) References Cited

U.S. PATENT DOCUMENTS

| | | | | |
|---|---|---|---|---|
| 5,452,268 A * | 9/1995 | Bernstein | ............ | H04R 19/005 367/181 |
| 6,847,090 B2 * | 1/2005 | Loeppert | ................ | H04R 19/04 257/418 |
| 6,940,564 B2 * | 9/2005 | Murden | ................ | G02F 1/1333 349/1 |
| 7,146,016 B2 * | 12/2006 | Pedersen | ............... | B81B 3/0072 381/175 |
| 7,152,481 B2 * | 12/2006 | Wang | ................... | B81B 3/0072 73/718 |
| 7,466,834 B2 * | 12/2008 | Ogura | ................... | B81B 7/0061 381/174 |
| 7,620,192 B2 * | 11/2009 | Yamaoka | ............. | H01G 5/0136 381/174 |
| 7,853,027 B2 * | 12/2010 | Yamaoka | ............ | B81C 1/00944 381/174 |
| 9,199,837 B2 * | 12/2015 | Kasai | .................... | B81B 7/0016 |
| 9,599,648 B2 * | 3/2017 | Kasai | .................... | H04R 19/005 |
| 9,641,939 B2 * | 5/2017 | Uchida | ................ | H04R 19/005 |
| 9,712,924 B2 * | 7/2017 | Yoo | ......................... | H04R 7/26 |
| 9,749,752 B2 * | 8/2017 | Yoo | ........................ | H04R 19/04 |
| 9,807,531 B2 * | 10/2017 | Yoo | ........................ | H04R 31/00 |
| 9,866,970 B2 * | 1/2018 | Yoo | ........................ | H04R 31/00 |
| 2012/0091544 A1 | 4/2012 | Reichenbach et al. | | |

* cited by examiner

SLOT PATTERN

SPRING PATTERN

- Prior Art -

FIG. 5

| ITEM | SLOT STRUCTURE | FIRST MODIFIED SLIT STRUCTURE (MODIFICATION #1) | SECOND MODIFIED SLIT STRUCTURE (MODIFICATION #2) | SLOT PATTERN STRUCTURE OF PRESENT INVENTION |
|---|---|---|---|---|
| SLOT STRUCTURE | (circular with 4 arc slots) | (circular with 2-row horizontal slits) | (circular with 1-row vertical slits) | (circular with 2-row crossing slits) |
| VIBRATION MEMBRANE STRUCTURE DESCRIPTION | - SLOT (SAME AS SLIT AREA) | - SLIT 2-ROW HORIZONTAL SEQUENTIAL ARRANGEMENT | - SLIT 1-ROW VERTICAL SEQUENTIAL ARRANGEMENT | - SLIT 2-ROW HORIZONTAL CROSSING ARRANGEMENT |
|  | - VIBRATION MEMBRANE(poly-si) → RADIUS : 500um, THICKNESS : 0.5um, STRESS : 10MPa | | | |
| ANALYSIS RESULTS | (displacement vs frequency graph) | (displacement vs frequency graph) | (displacement vs frequency graph) | (displacement vs frequency graph) |
|  | - RESONANCE FREQUENCY : 37kHz<br>- VIBRATION DISPLACEMENT : 25nm | - RESONANCE FREQUENCY : 41kHz<br>- VIBRATION DISPLACEMENT : 21nm | - RESONANCE FREQUENCY : 45kHz<br>- VIBRATION DISPLACEMENT : 17nm | - RESONANCE FREQUENCY : 31kHz<br>- VIBRATION DISPLACEMENT : 37nm |

FIG. 7
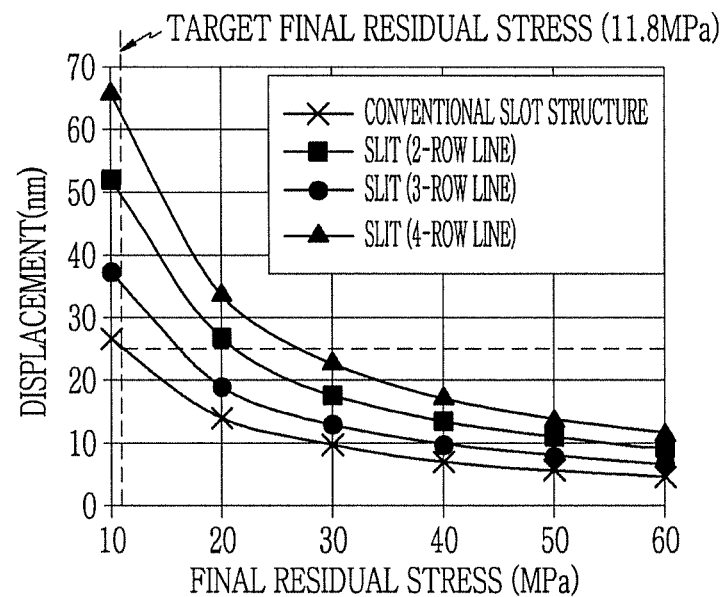
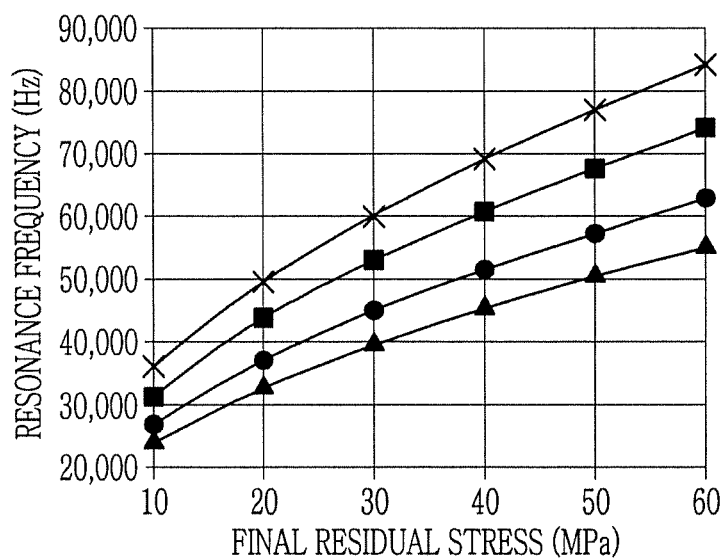

MICROPHONE AND MANUFACTURING METHOD THEREOF

CROSS-REFERENCE TO RELATED APPLICATION

This application is based on and claims the benefit of priority to Korean Patent Application No. 10-2017-0015151 filed on Feb. 2, 2017 with the Korean Intellectual Property Office, the entire disclosure of which is incorporated herein by reference.

TECHNICAL FIELD

The present disclosure relates to a microphone and a manufacturing method thereof, and more particularly, to a high-sensitivity micro-electro-mechanical systems (MEMS) microphone being robust and having superior vibration displacement to that of a conventionally developed spring structure, and a manufacturing method thereof.

BACKGROUND

A MEMS microphone serves to convert voice signals into electrical signals, and is manufactured by using a semiconductor batch process.

Compared to an electret condenser microphone (ECM) applied to most automotive vehicles, the MEMS microphone has excellent sensitivity and low performance variation per product, and can be ultra-miniaturized and strong against environmental changes such as heat, humidity, etc. As a result, development has recently been carried out in a direction of replacing the ECM with the MEMS microphone.

The MEMS microphone is classified into an electrostatic capacitive MEMS microphone and a piezoelectric MEMS microphone.

The electrostatic capacitive MEMS microphone includes a fixed membrane and a vibration membrane, and when a sound pressure (sound source) is applied from outside to the vibration membrane, a capacitance value varies as a distance between the fixed membrane and the vibration membrane varies. A thus-generated electric signal is used to measure a sound pressure.

For example, the electrostatic capacitive MEMS microphone measures a change in capacitance between the vibration membrane and the fixed membrane and outputs it as a voltage signal, i.e., sensitivity, which is one of the most important performance indexes of MEMS microphones.

Meanwhile, a technique to reduce rigidity of the vibration membrane is required in order to improve the sensitivity which is the major performance index of the MEMS microphone. To that end, a method of lowering residual stress of the vibration membrane, applying a spring structure, or the like has conventionally been developed.

For example, FIGS. 1A and 1B illustrate a vibrating membrane structure to which a slot pattern and a spring pattern are applied in order to improve a conventional sensitivity.

First, referring to FIG. 1A, a technique of reducing the rigidity by forming a slot pattern in a vibration membrane and increasing a slot length has been developed in the prior art in order to improve the sensitivity of the MEMS microphone.

However, according to the prior art, a chip size may increase to increase the slot length, and a sound source may be lost in a low band.

In addition, according to the prior art, a method of reducing a stress by applying a spring pattern to a vibration membrane has been developed, but process complexity may increase to realize a minute spring pattern in the vibration membrane, and a product yield may be lowered in an experiment, as shown in FIG. 1B.

Thus, it is urgently required to develop a new vibration membrane structure that can improve vibration displacement and robustness of the process in order to improve sensitivity, which is the major performance index of the MEMS microphone.

The above information disclosed in this Background section is only for enhancement of understanding of the background of the invention and therefore it may contain information that does not form the prior art that is already known in this country to a person of ordinary skill in the art.

PRIOR ART

Patent Document (Patent Document 1) Patent Document 1: Korean Registration Patent No. 1601219 (2016.03.08.)

SUMMARY

An exemplary embodiment of the present disclosure has been made in an effort to provide a high-sensitivity MEMS microphone having a vibration membrane structure in which minute slit patterns crossing in a horizontal direction are formed so as to be robust and have more improved vibration displacement in comparison with a spring structure of a conventional vibration membrane, and a manufacturing method thereof.

An exemplary embodiment of the present disclosure provides a microphone including: a substrate configured to have a through hole formed at a central portion thereof; a vibration membrane disposed to cover the through hole on the substrate to include a slit pattern in which slit patterns are arranged in a plurality of lines along a circular edge thereof; a fixed membrane separately mounted at an upper portion of the vibration membrane with an air layer therebetween to have a plurality of air inlets that extend therebetween in a direction of the air layer; and a support layer configured to support the fixed membrane separately mounted on the vibration membrane.

The slit patterns arranged in lines may be cross-formed to cross each other in the slit pattern.

The microphone may further include a pad configured to electrically connect each electrode to a semiconductor chip to measure electrostatic capacity in accordance with a change in distance between the fixed membrane and the vibration membrane.

The slit pattern may be formed by etching minute slit patterns of a constant length and distance at an edge thereof to improve a vibration displacement of the vibration membrane.

The slit pattern may have a slit pattern angle for a length of each of the slit patterns from a central axis of the vibration membrane that is greater than an angle between the slit patterns for determining an arrayed angle of the slit patterns.

A distance between slit lines may be greater than a slit width of the slit pattern in the slit pattern.

The fixed membrane may be formed to have a stacked structure in which an insulating layer, a fixed electrode, and a back plate are stacked, and a plurality of protrusions may be formed at a lower portion of the insulating layer.

The fixed membrane may include, on the back plate: a first pad formed in a first contact hole for opening the fixed electrode to contact a fixed electrode; and a second pad formed in a second contact hole for opening a vibration electrode of the vibration membrane to contact the vibration electrode.

An exemplary embodiment of the present disclosure provides a microphone manufacturing method including: forming an oxide layer on a substrate; forming a vibration membrane including a slit pattern in which slit patterns are arranged in a plurality of lines along a circular edge, at an upper portion of the oxide layer; forming a sacrificial layer at an upper portion of the vibration membrane, and forming a fixed membrane including a plurality of air inlets at an upper portion of the sacrificial layer; forming a through hole for inputting a sound source by etching a central portion of a rear surface of the substrate; and removing the oxide layer of an upper portion of the through hole, and forming an air layer and a support layer by removing a central portion of the sacrificial layer through the air inlets.

The forming of the vibration membrane may include: forming a vibration membrane of a conductive material on the oxide layer, and forming a photosensitive layer thereon; and forming a photosensitive layer pattern for forming the slit patterns by exposing and developing the photosensitive layer, and forming the slit pattern by etching a portion of the vibration membrane by using the photosensitive layer pattern as a mask.

In the forming of the sacrificial layer, the fixed membrane may be formed by sequentially stacking an insulating layer, a fixed electrode, and a back plate at an upper portion of the sacrificial layer, and the air inlets that extend therethrough in a same pattern may be formed by etching a sensing area of a central portion thereof.

The forming of the sacrificial layer may include: patterning a plurality of concave dimples at a central portion of an upper portion of the sacrificial layer; and forming a plurality of protrusions at a lower portion of the insulating layer by the dimples by stacking an insulating layer on the sacrificial layer.

The forming of the sacrificial layer may include: forming a fixed electrode at an upper portion of the insulating layer; and forming a via hole for exposing a conductive line of the vibration membrane by etching portions of the insulating layer and the sacrificial layer.

The forming of the sacrificial layer may include forming a first contact hole for opening a conductive line of the fixed electrode and a second contact hole for opening a conductive line of the vibration electrode by etching a portion of a back plate as an uppermost layer of the fixed membrane.

The forming of the sacrificial layer may include: patterning the first contact into a first pad to contact a conductive line of the fixed electrode; and patterning the second contact hole into a second pad to contact a conductive line of the vibration electrode.

According to the exemplary embodiment of the present disclosure, it is possible to obtain robust and more improved vibration displacement in comparison with a spring structure of a conventional vibration membrane, by forming a minute slit pattern in the horizontal direction according to an edge of the vibration membrane.

In addition, improved vibration displacement with low rigidity may be derived as compared with a conventional slot structure by arranging minute slit patterns in which a plurality of slit lines are formed in the vibration membrane, thereby improving the sensitivity as the major performance index of the microphone.

BRIEF DESCRIPTION OF THE DRAWINGS

FIG. 5 illustrates an experiment result for deriving a structure of a slit pattern of a vibration membrane according to an exemplary embodiment of the present disclosure.

FIG. 7 illustrates an experiment result of slit structure optimization depending on various structures of a slit pattern according to an exemplary embodiment of the present disclosure.

DETAILED DESCRIPTION

Figure 1A:
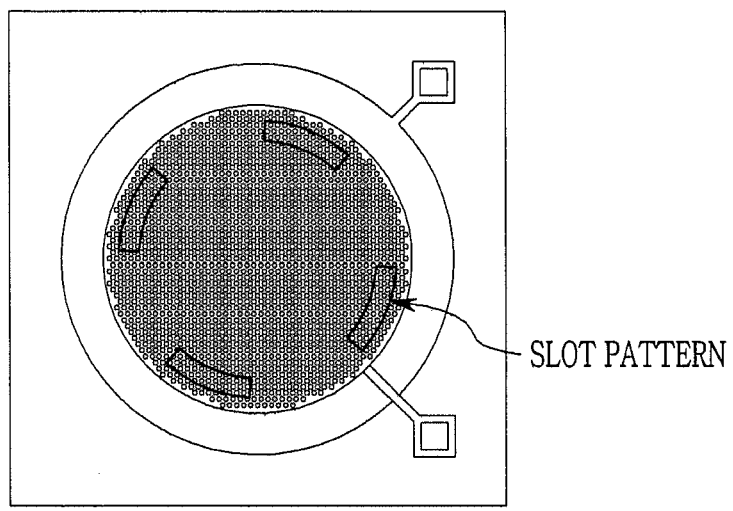
FIGS. 1A and 1B illustrate a vibration membrane structure to which a slot pattern and a spring pattern are applied for improving conventional sensitivity.
Figure 1B:
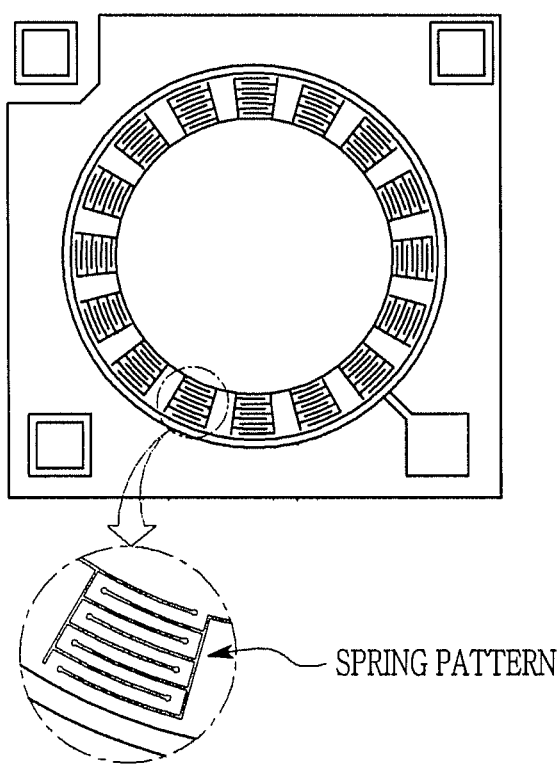

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

In addition, unless explicitly described to the contrary, the word "comprise" and variations such as "comprises" or "comprising" throughout the specification will be understood to imply the inclusion of stated elements but not the exclusion of any other elements. In addition, the terms "-er", "-or", and "module" described in the specification mean units for processing at least one function and operation, and can be implemented by hardware components or software components and combinations thereof.

Throughout the specification, the drawings and description are to be regarded as illustrative in nature and not restrictive, and thickness of layers (or films), regions, etc., are exaggerated for clarity.

It will be understood that when an element such as a layer, film, region, or substrate is referred to as being "on" another element, it can be directly on the other element or intervening elements may also be present.

Throughout the specification, a sound source inputted into a microphone has a same meaning as sound and sound pressure to vibrate a vibration membrane.

Hereinafter, a microphone and a manufacturing method thereof according to an exemplary embodiment of the present disclosure will be described with reference to the accompanying drawings.

Figure 2:
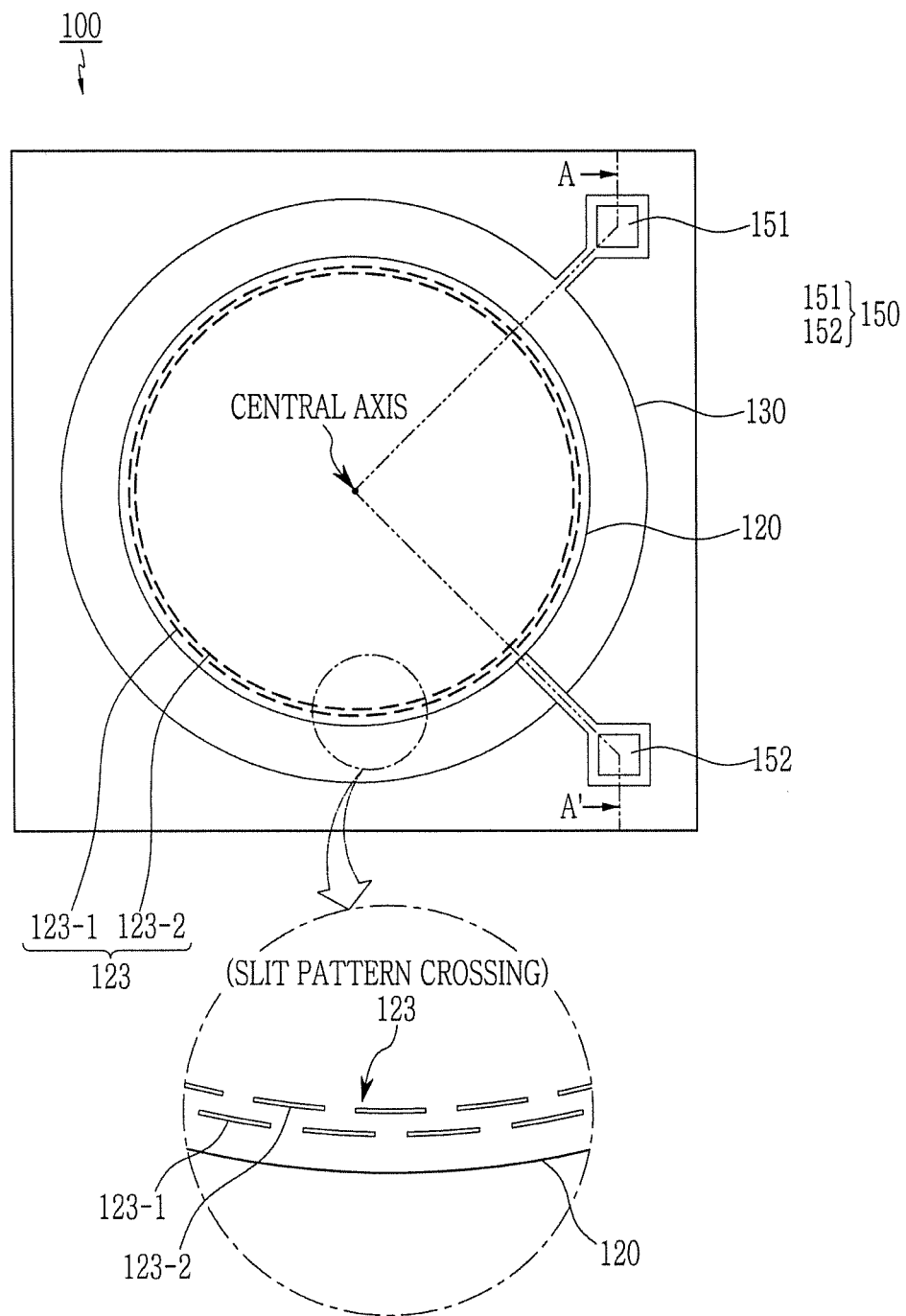
FIG. 2 schematically illustrates a planar structure of a microphone according to an exemplary embodiment of the present disclosure microphone.

FIG. 2 schematically illustrates a planar structure of a microphone according to an exemplary embodiment of the present disclosure microphone.

Figure 3:
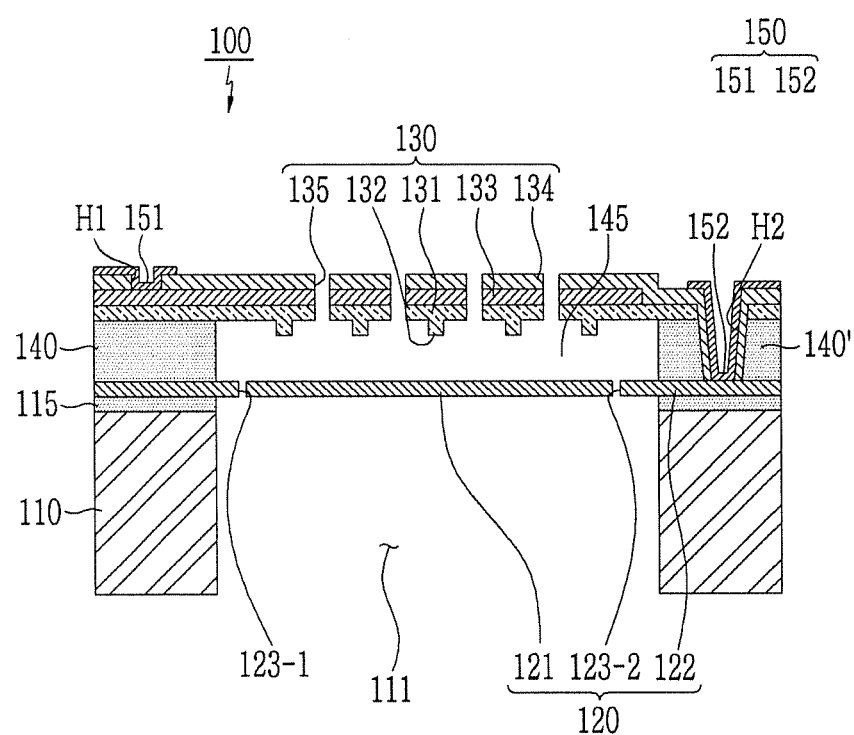
FIG. 3 is a cross-sectional view taken along a line A-A' of FIG. 2, illustrating the microphone according to an exemplary embodiment of the present disclosure microphone.

FIG. 3 is a cross-sectional view taken along a line A-A' of FIG. 2, illustrating the microphone according to an exemplary embodiment of the present disclosure microphone.

Referring to FIG. 2 and FIG. 3, according to an exemplary embodiment of the present disclosure, the microphone 100 includes a substrate 110, a vibration membrane 120, a fixed membrane 130, a support layer 140, and a pad 150.

The substrate 110 may be made of silicon to have a through hole 111 for inputting a sound source (sound pressure), formed at a central portion thereof.

The vibration membrane 120 is disposed on the substrate 110 to cover the through hole 111.

Accordingly, a portion of the vibration membrane 120 is exposed by the through hole 111 formed in the substrate, and the exposed portion thereof is vibrated by a sound source transferred from the outside.

An oxide layer 115 is disposed between the substrate 110 and the vibration membrane 120, and a central portion thereof is opened (etched) such that the through hole 111 internally extends.

The vibration membrane 120 may be made of polysilicon or a silicon nitride (SiNx), but it is not limited thereto. For example, any material having conductivity may be employed.

Particularly, according to the exemplary embodiment of the present disclosure, the vibration membrane 120 is formed to have a structure capable of reducing capacity by etching a minute slit pattern in an edge of a circular vibration membrane edge to act like a spring structure in order to improve vibration displacement of the vibration membrane 120.

In detail, the vibration membrane 120 includes a vibration electrode 121, a conductive line 122, and a slit pattern 123.

The vibration electrode 121 is vibrated by the sound source inputted from the through hole 111.

The conductive line 122 contacts a second pad 152 to be electrically connected to a semiconductor chip (not illustrated).

The slit pattern 123 includes minute slit patterns arrayed in a plurality of circles along an edge thereof with respect to a central axis of the vibration membrane 120.

In this case, in the slit pattern 123, minute slit patterns arrayed in each of a first slit line 123-1 and a second slit line 123-2 which are respectively disposed at an inner side and an outer side with respect to the central axis are cross-formed to cross each other instead of being aligned with each other.

Figure 4:
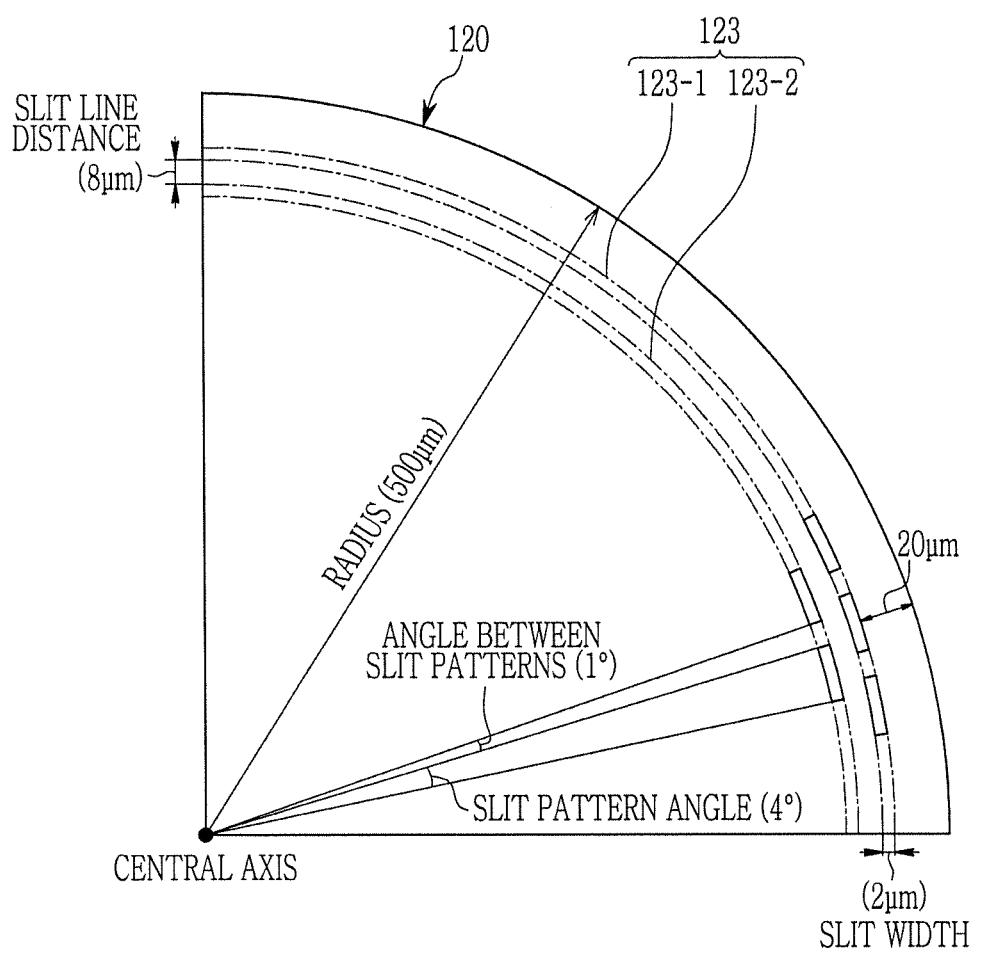
FIG. 4 illustrates a detailed structure of a slit pattern according to an exemplary embodiment of the present disclosure.

For example, FIG. 4 illustrates a detailed structure of a slit pattern according to an exemplary embodiment of the present disclosure.

Referring to FIG. 4, according to an exemplary embodiment of the present disclosure, the slit pattern 123 may be formed by etching the minute slit patterns in regular lengths and distances in order to improve the vibration displacement of the vibration membrane 120. The slit patterns may be seen as if circular dotted lines are formed at the edge of the vibration membrane 120 due to very fine slit widths of 2 μm.

In this case, in the slit pattern 123, a slit pattern angle (e.g., 4°) for determining a length of each slit pattern from the central axis may be greater than an angle (e.g., 1°) between the slit patterns for determining an arrayed angle of the slit patterns.

Accordingly, the length of the slit patterns may be longer than the distance between the slit patterns.

Further, a distance (e.g., 8 μm) between the first slit line 123-1 and the second slit line 123-2 may be greater than a slit width (e.g., 2 μm) of the slit patterns.

In addition, FIG. 4 illustrates holes of the slit patterns having a rectangular shape, but the present disclosure is not limited thereto. For example, opposite surfaces of the holes may be rounded in a semicircle form to prevent damage by vibration.

In the above description, an example of detailed dimensions for forming the slit pattern 123 in the vibration membrane 120 can be derived through a slit structure optimization test according to a residual stress of the vibration membrane. However, the detailed dimensions thereof are not limited to the above example, and may be changed to various dimensions to form the slit patterns.

Turning back to FIG. 3, the fixed membrane 130 is separately mounted in an upper portion of the vibration membrane 120 with an air layer 145 therebetween, and includes a plurality of air inlets 135 that are formed in a direction of the air layer 145.

The fixed membrane 130 may be formed as a sequential stacked structure including an insulating layer 131, a fixed electrode 133, and a back plate 134.

An edge portion of the insulating layer 131 is supported and fixed by the support layer 140 made of an oxide, and a plurality of protrusions 132 are formed at a lower portion thereof.

Herein, the support layer 140 is disposed in an upper edge of the vibration membrane 120 and is formed by etching a portion of a sacrificial layer 140' in a manufacturing method of the microphone 100 to be described later, and the air layer 145 indicates a space formed by the etching of the sacrificial layer 140'.

The protrusions 132 formed at a lower portion of the insulating layer 131 protrude toward the vibration membrane 120. Accordingly, when the vibration membrane 120 vibrates, the protrusions 132 serve to prevent direct contact between electrodes of the vibration membrane 120 and the fixed membrane 130.

The fixed electrode 133 senses a vibration displacement of the vibration membrane 120, and includes a conductive line that contacts a first pad 151 in a same manner as the vibration membrane 120.

The back plate 134 may be formed by stacking a silicon nitride (SiNx) at an upper portion of the fixed electrode 133.

The air inlets 135 having a same pattern as the insulating layer 131 and the fixed electrode 133 are extended from a central portion of the back plate 134, and a first contact hole H1 for opening the conductive line of the fixed membrane 130 and a second contact hole H2 for opening the conductive line of the vibration membrane 120 are formed on opposite sides of the back plate 134.

The pad 150 includes metal pads for electrically connecting each electrode to the semiconductor chip in order to measure electrostatic capacity in accordance with a change in distance between the fixed membrane 130 and the vibration membrane 120.

The pad 150 includes the first pad 151 formed to contact the fixed electrode 133 by patterning the first contact hole H1 and the second pad 152 formed to contact the vibration electrode 121 by patterning the second contact hole H2.

Meanwhile, FIG. 5 illustrates an experiment result for deriving a structure of a slit pattern of a vibration membrane according to an exemplary embodiment of the present disclosure.

Referring to FIG. 5, experimental results of resonance frequencies and vibration displacements by generating a conventional slot structure having a same slit area as the present disclosure, a first modified slit structure (Modification #1) in which slit 2-row lines are sequentially arranged in parallel horizontally, a second modified slit structure (Modification #2) in which slit 1-row lines are sequentially vertically arranged, and a slot pattern structure of the present disclosure in which slit 2-row lines are horizontally cross-arranged to cross each other are shown.

As a result of comparing and examining the analysis of each vibration membrane structure through the above experiments, it is seen that the slit pattern structure in which slit 2-row lines are vertically cross-arranged to cross each other according to the exemplary embodiment of the present disclosure has improved vibration displacement of 1.5 to 2.1 times that of another structure while satisfying a target resonance frequency (>31 kHz) for securing a voice band.

Improved vibration displacement with low rigidity may be derived as compared with a conventional slot structure through the slit pattern 123 of the vibration membrane 120 according to the exemplary embodiment of the present disclosure, thereby improving the sensitivity as the major performance index of the microphone.

The slit pattern 123 of vibration membrane 120 described above has been described to include slit 2-row lines that cross, but the present disclosure is not limited to the above exemplary embodiment. Various modifications for deriving other slit structure optimizations are possible.

Figure 6:
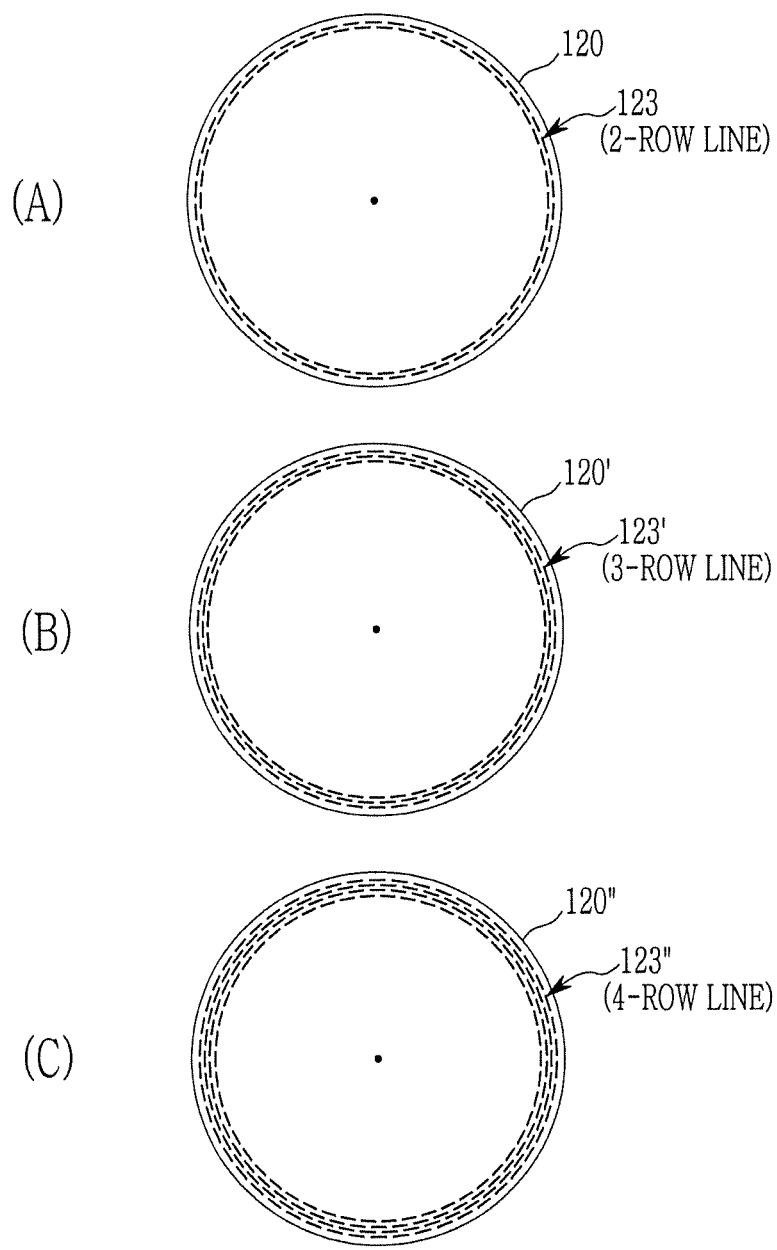
FIG. 6 illustrates various structures of a slit pattern according to an exemplary embodiment of the present disclosure.

For example, FIG. 6 illustrates various structures of a slit pattern according to an exemplary embodiment of the present disclosure.

Referring to FIG. 6, variously modified slit patterns are illustrated to derive an optimized structure of the slit pattern 123 formed in the vibration membrane 120 according to the exemplary embodiment of the present disclosure.

Referring to FIG. 6 (A), the slit pattern 123 in which slit 2-row lines described above cross is illustrated.

In addition, FIG. 6 (B) illustrates a slit pattern 123' in which slit 3-row lines cross, and FIG. 6 (C) illustrates a slit pattern 123" in which slit 4-row lines cross.

Experiments were performed to measure vibration displacement and a resonance frequency depending on various exemplary embodiments of a structure obtained by adding slit lines to the slit pattern 123 in which slit 2-row lines cross and a change in final residual stress of the vibration membrane of a conventional slot structure.

FIG. 7 illustrates an experiment result of slit structure optimization depending on various structures of a slit pattern according to an exemplary embodiment of the present disclosure.

Referring to FIG. 7, as a result of analyzing vibration displacement and a resonance frequency depending on the change in the final residual stress of the vibration membrane, a target final residual stress (11.8 MPa) was about 25 nm in the case of the conventional slot structure, whereas it was about 35 nm in the case of the slit pattern 123 in which slit 2-row lines cross. Accordingly, it can be seen that the vibration displacement is improved in the case of the slit pattern 123.

Specifically, in the case of the slit pattern 123, a result in which the vibration displacement is increased by 33% as compared with the conventional slot structure is seen, and it is seen that a target resonance frequency (≥30 kHz) for securing a frequency response characteristic can be secured.

In addition, it is seen that a margin of final residual stress of 15 MPa at a maximum can be secured in a vibration membrane 120" having a four-line slit structure compared to the conventional slot structure.

When these results are synthesized, as a result of additional design of slit pattern split corresponding to an error of the final residual stress and an analysis verification result, as the number of slit lines increases, the rigidity of the vibration membrane decreases, and thus the vibration displacement increases and the resonance frequency decreases.

Meanwhile, a microphone manufacturing method according to an exemplary embodiment of the present disclosure will be described with the accompanying drawings based on the aforementioned structure of the microphone 100, assuming the slit pattern 123 in which slit 2-row lines cross.

FIG. 8 to FIG. 14 sequentially illustrate a manufacturing method of a microphone according to an exemplary embodiment of the present disclosure microphone.

Figure 8:
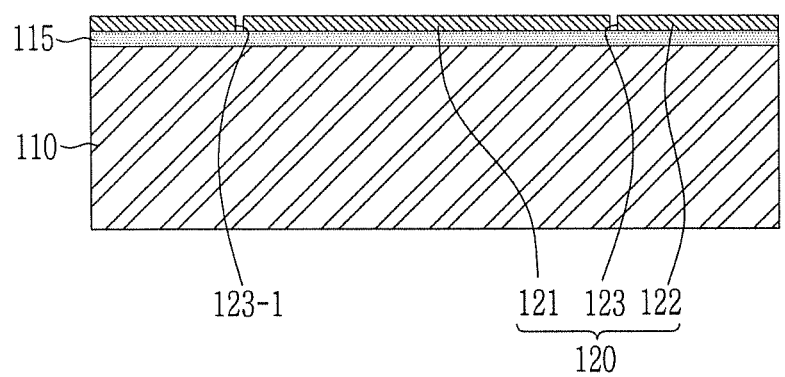
FIG. 8 to FIG. 14 sequentially illustrate a manufacturing method of a microphone according to an exemplary embodiment of the present disclosure microphone.

First, referring to FIG. 8, the substrate 110 is prepared, and the oxide layer 115 is formed at an upper portion of the substrate 110. Herein, the substrate 110 may be formed of silicon, and the oxide layer 115 may be formed by stacking a silicon oxide.

Next, a vibration membrane including the slit pattern 123 in which the slit patterns are arranged in a plurality of lines along an edge thereof is formed at an upper portion of the oxide layer 115.

For example, the minute slit pattern 123 arrayed in a plurality of circles is formed by patterning a portion of an edge of the vibration membrane 120 based on a central axis thereof.

Specifically, the slit pattern 123 is obtained by forming the vibration membrane 120 of a polysilicon or a conductive material on the oxide layer 115 and forming a photosensitive layer thereon.

Then, a photosensitive layer pattern for forming the slit patterns may be formed by exposing and developing the photosensitive layer, and a portion of the vibration membrane 120 may be etched by using the photosensitive layer pattern as a mask.

Figure 9:
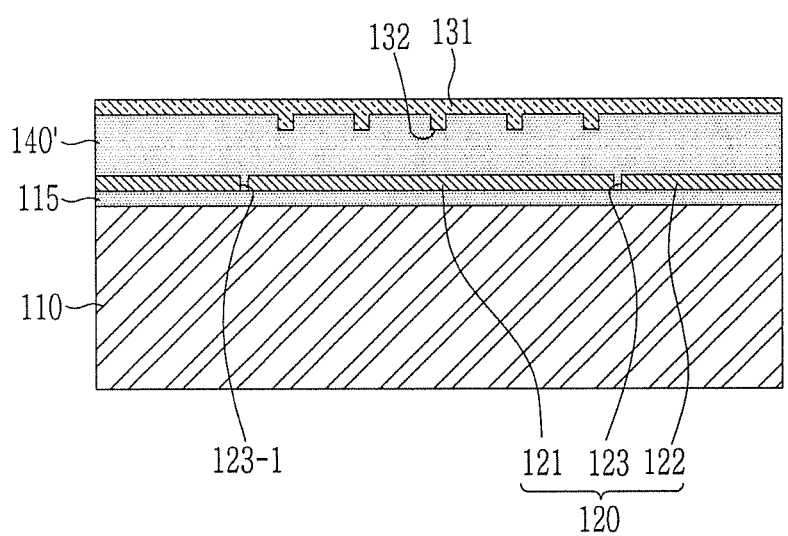

Referring to FIG. 9, a plurality of sacrificial layers 140' are formed at the upper portion of the vibration membrane 120, and a plurality of concave dimples are patterned at a central portion of the sacrificial layers 140'.

Then, an insulating layer 131 is stacked on the sacrificial layers 140' to form a plurality of protrusions 132 at a lower portion of the insulating layer 131 by the dimples.

Figure 10:
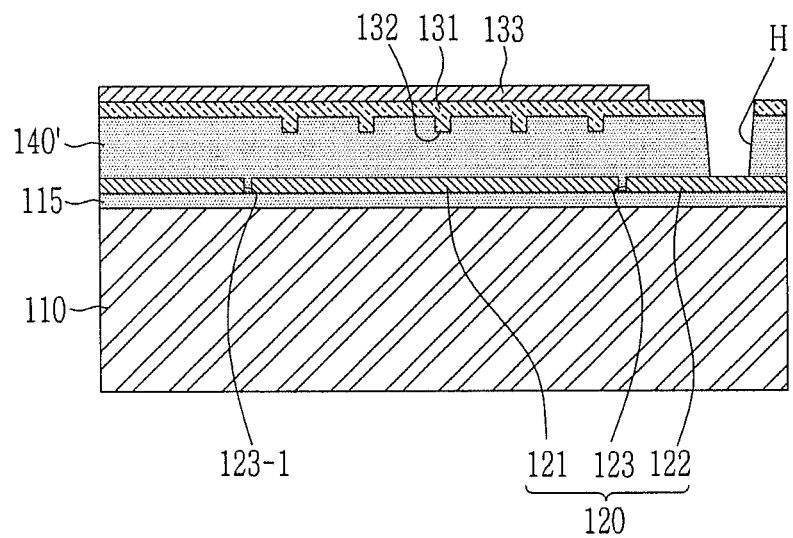

Referring to FIG. 10, the fixed electrode 133 is formed at an upper portion of the insulating layer 131, and a via hole H with an opened upper portion is formed by partially etching the insulating layer 131 and the sacrificial layer 140'.

The via hole H may be formed by etching the insulating layer 131 and the sacrificial layer 140' until the conductive lines 122 of the vibration membrane 120 are exposed.

Figure 11:
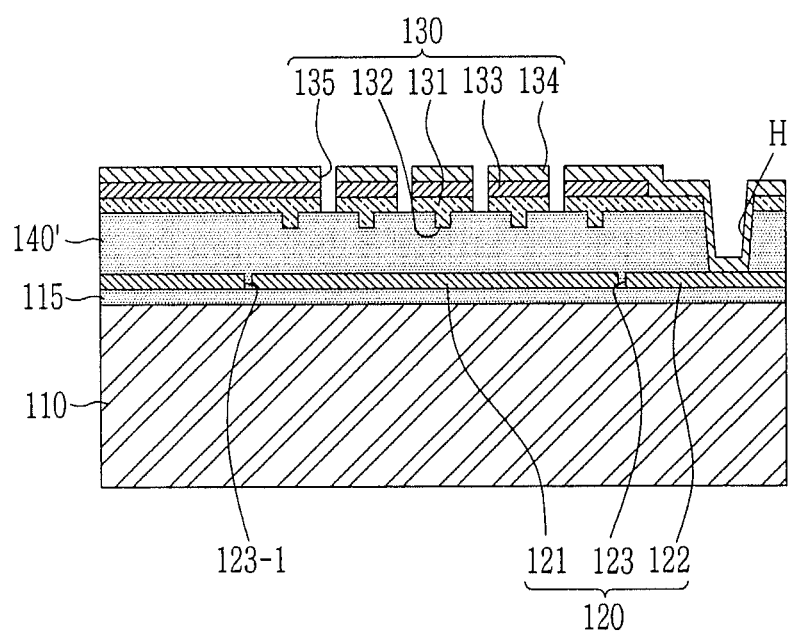

Referring to FIG. 11, a back plate 134 is formed at upper portions of the fixed electrode 133 and the insulating layer 131.

The back plate 134 may be formed by stacking a silicon nitride (SiNx).

Then, a plurality of air inlets 135 that extend therethrough in a same pattern are formed by etching the back plate 134 and the fixed electrode 133, and the insulating layer 131 positioned therebelow.

In this case, the air inlets 135 may be formed by performing dry etching or wet etching until the sacrificial layers 140' are exposed.

In these steps, the air inlets 135 formed in a same pattern are formed in a sensing area of a central portion thereof to constitute the fixed membrane 130 in a state in which the insulating layer 131 having a plurality of protrusions 132 formed therein, the fixed electrode 133, and the back plate 134 are sequentially stacked.

Herein, the sensing area may be a vibration region of the vibration membrane 120 and a through hole 111 through which a sound source is introduced into the vibration membrane 120. The number of the protrusions 132 formed in the sensing area and the number of the air inlets 135 are not limited to those shown in the drawing.

Figure 12:
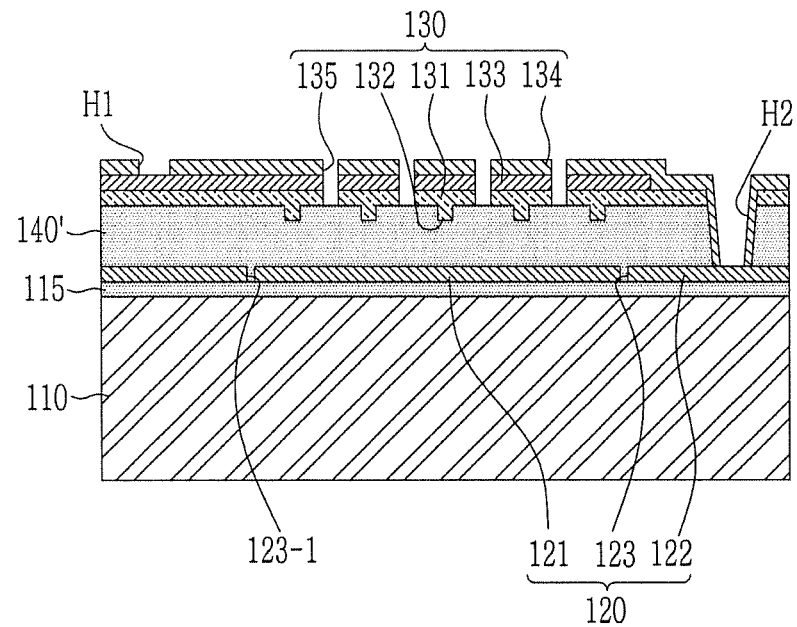

Referring to FIG. 12, a first contact hole H1 for opening a conductive line of the fixed electrode 133 and a second contact hole H2 for opening the conductive line 122 of the vibration electrode 121 are formed by etching a portion of the back plate 134.

Figure 13:
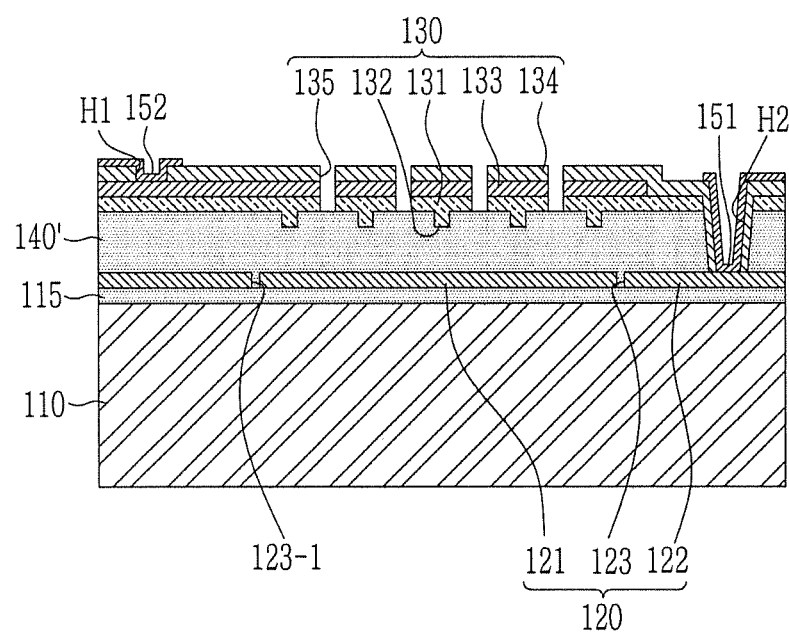

Referring to FIG. 13, the first contact hole H1 is patterned into a first pad 151, and the second contact hole H2 is patterned into a second pad 152.

The fixed electrode 133 and the vibration electrode 121 are respectively electrically connected to an external processing component though the first pad 151 and the second pad 152.

Figure 14:
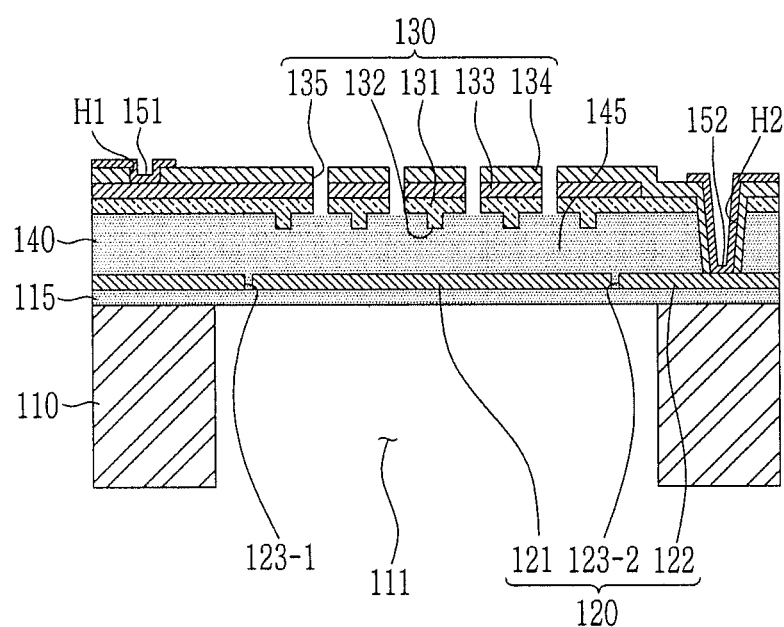

Referring to FIG. 14, a through hole 111 for inputting a sound source is formed by etching a central portion of a rear surface of the substrate 110.

Sequentially, the structure of the microphone 100 illustrated in FIG. 3 according to the present exemplary embodiment may be generated by removing the oxide layer 115 positioned in the through hole 111 of the substrate 110 and the central portion of the sacrificial layer 140'.

In this case, an air layer 145 is formed in the removed region of the sacrificial layer 140', and a support layer 140 is formed to support an edge of the fixed membrane 130.

The air layer 141 may be formed by removing the sacrificial layer 140' by a wet method using an etching solution through the air inlets 135. In addition, the sacrificial layer 140' can be removed by a dry method of ashing depending on oxygen plasma (O₂ plasma) through the air inlets 135.

The aforementioned microphone manufacturing method according to the exemplary embodiment of the present disclosure has been described assuming the slit pattern 123 in which slit 2-row lines cross, but the present disclosure is not limited thereto. For example, it shall be obvious that it includes 3 slit lines and 4 slit lines.

As such, according to the exemplary embodiment of the present disclosure, it is possible to obtain a robust and more improved vibration displacement in comparison with a spring structure of a conventional vibration membrane, by forming a minute slit pattern in the horizontal direction according to an edge of the vibration membrane.

In addition, improved vibration displacement with low rigidity may be derived as compared with a conventional slot structure by arranging minute slit patterns in which a plurality of slit lines are formed in the vibration membrane, thereby improving the sensitivity as the major performance index of the microphone.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A microphone comprising:
    a substrate configured to have a through hole formed at a central portion thereof;
    a vibration membrane disposed to cover the through hole on the substrate to include a slit pattern in which slit patterns are arranged in a plurality of lines along a circular edge thereof;
    a fixed membrane separately mounted at an upper portion of the vibration membrane with an air layer therebetween to have a plurality of air inlets that extend therebetween in a direction of the air layer;
    a support layer configured to support the fixed membrane separately mounted on the vibration membrane; and
    a pad configured to electrically connect each electrode to a semiconductor chip to measure electrostatic capacity in accordance with a change in distance between the fixed membrane and the vibration membrane.

2. The microphone of claim 1, wherein the slit patterns arranged in lines are cross-formed to cross each other in the slit pattern.

3. The microphone of claim 1, wherein the slit pattern is formed by etching minute slit patterns of a constant length and distance at an edge thereof to improve a vibration displacement of the vibration membrane.

4. The microphone of claim 1, wherein the slit pattern has a slit pattern angle for a length of each of the slit patterns from a central axis of the vibration membrane that is greater than an angle between the slit patterns for determining an arrayed angle of the slit patterns.

5. The microphone of claim 4, wherein a distance between slit lines is greater than a slit width of the slit pattern in the slit pattern.

6. The microphone of claim 1, wherein the fixed membrane is formed to have a stacked structure in which an insulating layer, a fixed electrode, and a back plate are stacked, and a plurality of protrusions are formed at a lower portion of the insulating layer.

7. The microphone of claim 6, wherein the fixed membrane includes, on the back plate: a first pad formed in a first contact hole for opening the fixed electrode to contact a fixed electrode; and
    a second pad formed in a second contact hole for opening a vibration electrode of the vibration membrane to contact the vibration electrode.

8. A microphone manufacturing method comprising:
    forming an oxide layer on a substrate;
    forming a vibration membrane including a slit pattern in which slit patterns are arranged in a plurality of lines along a circular edge, at an upper portion of the oxide layer;
    forming a sacrificial layer at an upper portion of the vibration membrane, and forming a fixed membrane including a plurality of air inlets at an upper portion of the sacrificial layer;
    forming a through hole for inputting a sound source by etching a central portion of a rear surface of the substrate; and
    removing the oxide layer of an upper portion of the through hole, and forming an air layer and a support layer by removing a central portion of the sacrificial layer through the air inlets.

9. The microphone manufacturing method of claim 8, wherein the forming of the vibration membrane includes:
    forming a vibration membrane of a conductive material on the oxide layer, and forming a photosensitive layer thereon; and
    forming a photosensitive layer pattern for forming the slit patterns by exposing and developing the photosensitive layer, and forming the slit pattern by etching a portion of the vibration membrane by using the photosensitive layer pattern as a mask.

10. The microphone manufacturing method of claim 8, wherein, in the forming of the sacrificial layer, the fixed membrane is formed by sequentially stacking an insulating layer, a fixed electrode, and a back plate at an upper portion of the sacrificial layer, and the air inlets that extend therethrough in a same pattern are formed by etching a sensing area of a central portion thereof.

11. The microphone manufacturing method of claim 8, wherein the forming of the sacrificial layer includes:
   patterning a plurality of concave dimples at a central portion of an upper portion of the sacrificial layer; and
   forming a plurality of protrusions at a lower portion of the insulating layer by the dimples by stacking an insulating layer on the sacrificial layer.

12. The microphone manufacturing method of claim 11, wherein the forming of the sacrificial layer includes: forming a fixed electrode at an upper portion of the insulating layer; and forming a via hole for exposing a conductive line of the vibration membrane by etching portions of the insulating layer and the sacrificial layer.

13. The microphone manufacturing method of claim 12, wherein the forming of the sacrificial layer includes forming a first contact hole for opening a conductive line of the fixed electrode and a second contact hole for opening a conductive line of the vibration electrode by etching a portion of a back plate as an uppermost layer of the fixed membrane.

14. The microphone manufacturing method of claim 13, wherein the forming of the sacrificial layer includes: patterning the first contact into a first pad to contact a conductive line of the fixed electrode; and patterning the second contact hole into a second pad to contact a conductive line of the vibration electrode.

\* \* \* \* \*